(12) United States Patent
Tanaka

(10) Patent No.: US 9,607,824 B2
(45) Date of Patent: Mar. 28, 2017

(54) SEMICONDUCTOR DEVICE INCLUDING H-BN INSULATING LAYER AND ITS MANUFACTURING METHOD

(71) Applicant: STANLEY ELECTRIC CO., LTD., Meguro-ku, Tokyo (JP)

(72) Inventor: Kazufumi Tanaka, Akishima (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/958,644

(22) Filed: Dec. 3, 2015

(65) Prior Publication Data

US 2016/0163537 A1    Jun. 9, 2016

(30) Foreign Application Priority Data

Dec. 4, 2014 (JP) ................... 2014-245825

(51) Int. Cl.
| | |
|---|---|
| *H01L 21/02* | (2006.01) |
| *H01L 21/3105* | (2006.01) |
| *H01L 33/08* | (2010.01) |
| *H01L 33/62* | (2010.01) |
| *H01L 33/20* | (2010.01) |

(52) U.S. Cl.
CPC .. *H01L 21/02172* (2013.01); *H01L 21/02266* (2013.01); *H01L 21/3105* (2013.01); *H01L 33/08* (2013.01); *H01L 33/62* (2013.01); *H01L 33/20* (2013.01)

(58) Field of Classification Search
None
See application file for complete search history.

(56) References Cited

U.S. PATENT DOCUMENTS

| | | | | |
|---|---|---|---|---|
| 2005/0248422 A1* | 11/2005 | Joodaki | ................. | H01P 11/003 333/246 |
| 2011/0204409 A1* | 8/2011 | Sung | ................... | H05K 1/0373 257/99 |
| 2014/0327335 A1* | 11/2014 | Mabuchi | .................. | H01F 5/06 310/208 |
| 2015/0052823 A1* | 2/2015 | Kuntz | .................... | B24D 3/00 51/307 |

FOREIGN PATENT DOCUMENTS

JP          2014120511 A     6/2014

* cited by examiner

*Primary Examiner* — Matthew Reames
*Assistant Examiner* — Steven B Gauthier
(74) *Attorney, Agent, or Firm* — Holtz, Holtz & Volek PC

(57) ABSTRACT

A semiconductor device includes a support substrate, an insulating layer provided on the support substrate, and a semiconductor element provided on the insulating layer. The insulating layer has a lower insulating layer consisting of amorphous boron nitride, and an upper insulating layer provided on the lower insulating layer and including amorphous boron nitride and an hexagonal system boron nitride (h-BN) particles.

2 Claims, 19 Drawing Sheets

SAMPLE 1
(1st Embodiment)

SAMPLE 2
(1st Embodiment)

SAMPLE 3
(2nd Embodiment)

SAMPLE 4

SAMPLE 5
(Prior Art)

SAMPLE 6

FOR SAMPLES 1, 2, 3, 4 & 5

FOR SAMPLE 6

FIG. 14A

| HE(°C) | T1 (°C) at P1 | | | | | |
|---|---|---|---|---|---|---|
| | SAMPLE 1 | SAMPLE 2 | SAMPLE 3 | SAMPLE 4 | SAMPLE 5 | SAMPLE 6 |
| 177.5 | 118.0 | 119.0 | 123.5 | 114.0 | 111.2 | 120.9 |
| 98.5 | 73.1 | 73.5 | 77.4 | 70.9 | 69.0 | 77.4 |

FIG. 14B

| HE(°C) | T2 (°C) at P2 | | | | | |
|---|---|---|---|---|---|---|
| | SAMPLE 1 | SAMPLE 2 | SAMPLE 3 | SAMPLE 4 | SAMPLE 5 | SAMPLE 6 |
| 177.5 | 110.1 | 108.7 | 111.2 | 99.4 | 101.2 | 106.7 |
| 98.5 | 69.8 | 65.4 | 67.4 | 63.0 | 60.4 | 70.4 |

US 9,607,824 B2

SEMICONDUCTOR DEVICE INCLUDING H-BN INSULATING LAYER AND ITS MANUFACTURING METHOD

This application claims the priority benefit under 35 U.S.C. §119 to Japanese Patent Application No. JP2014-245825 filed on Dec. 4, 2014, which disclosure is hereby incorporated in its entirety by reference.

BACKGROUND

Field

The presently disclosed subject matter relates to a semiconductor device and its manufacturing method.

Description of the Related Art

Generally, a semiconductor light-emitting device formed by a light-emitting diode (LED) element is used as a backlight for a liquid crystal, display (LCD) apparatus, a light for an industrial apparatus and the like.

A prior art semiconductor light-emitting device is constructed by thermally-pressuring a semiconductor body to a support body which includes a support substrate made of heat dissipating material such as silicon (Si), an insulating layer formed on the support substrate made of silicon dioxide, and wiring layers formed on the insulating layer (see: JP2014-120511A).

In the above-described prior art semiconductor light-emitting device, however, since the thermal conductivity of the insulating layer made of silicon dioxide is low, the heat dissipating effect of the insulating layer is insufficient, so that it is impossible to completely dissipate heat from the semiconductor body through the substrate body. Thus, due to the generation of heat by the semiconductor body, the semiconductor light-emitting device would deteriorate and its lifetime would he shortened.

SUMMARY

The presently disclosed subject matter seeks to solve one or more of the above-described problems.

According to the presently disclosed subject matter, a semiconductor device includes a support substrate, an insulating layer provided on the support substrate, and a semiconductor element provided on the insulating layer. The insulating layer has a lower insulating layer consisting of amorphous boron nitride, and an upper insulating layer provided on the lower insulating layer and including amorphous boron nitride and hexagonal system boron nitride (h-BN) particles.

In a method for manufacturing a semiconductor device, a first sputtering process is performed upon a hexagonal system boron nitride target using a sputtering gas excluding nitrogen gas to form a lower insulating layer made of amorphous boron nitride on a support substrate, and a second sputtering process is performed upon the hexagonal system boron nitride target using the sputtering gas and nitrogen gas to form an upper insulating layer made of amorphous boron nitride and hexagonal system boron nitride on the lower insulating layer.

According to the presently disclosed subject matter, since the h-BN particles have an extremely large thermal conductivity, heat generated from the semiconductor element is efficiently dissipated via the insulating layer including the h-BN particles to the support substrate.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIGS. 14A and 14B are tables showing the temperatures at the heater area and the temperature measuring points of FIGS. 13A and 13B;

DETAILED DESCRIPTION OF EXEMPLARY EMBODIMENTS

Figure 1:
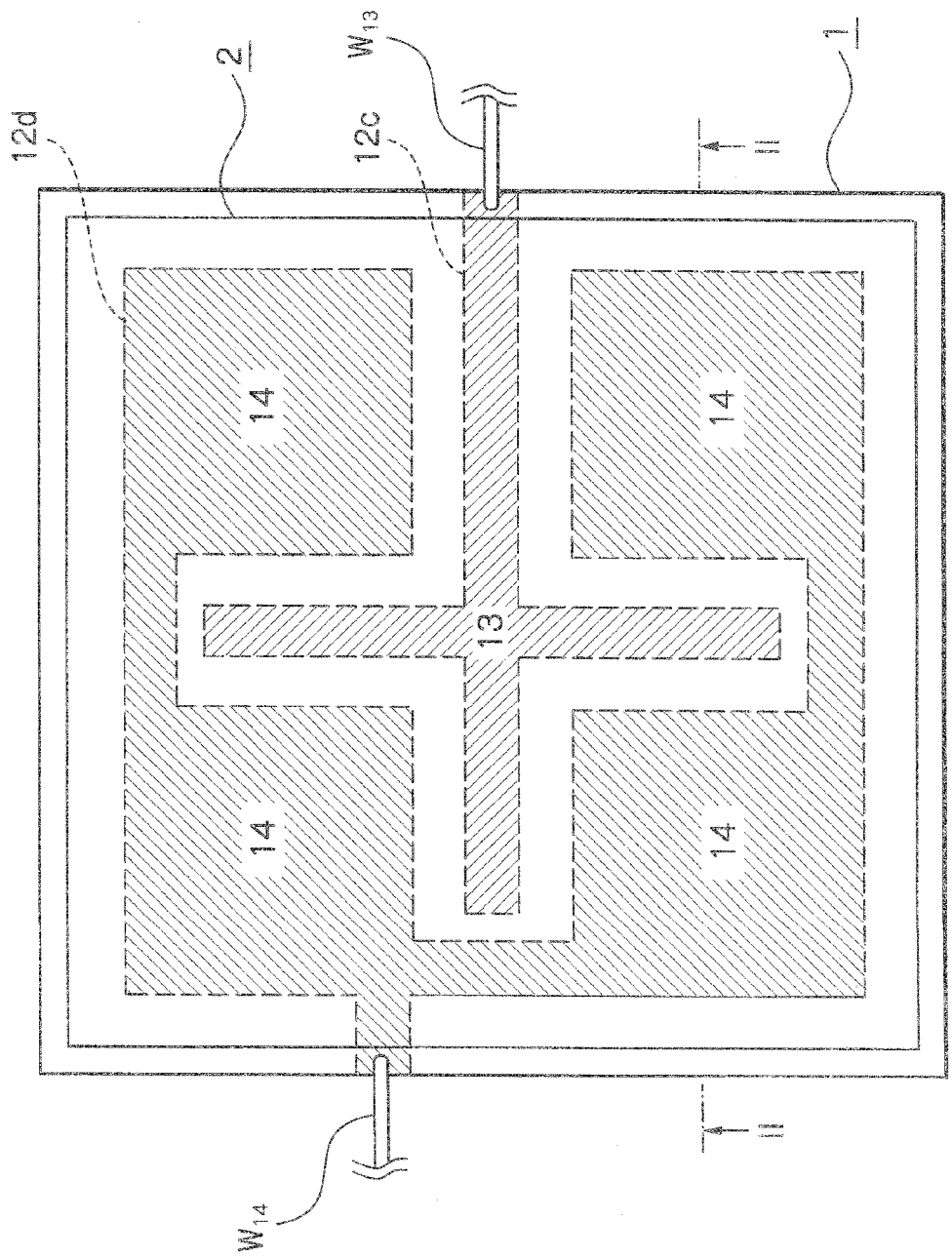
FIG. 1 is a plan view illustrating a first embodiment of the semiconductor light-emitting device according to the presently disclosed subject matter.
Figure 2:
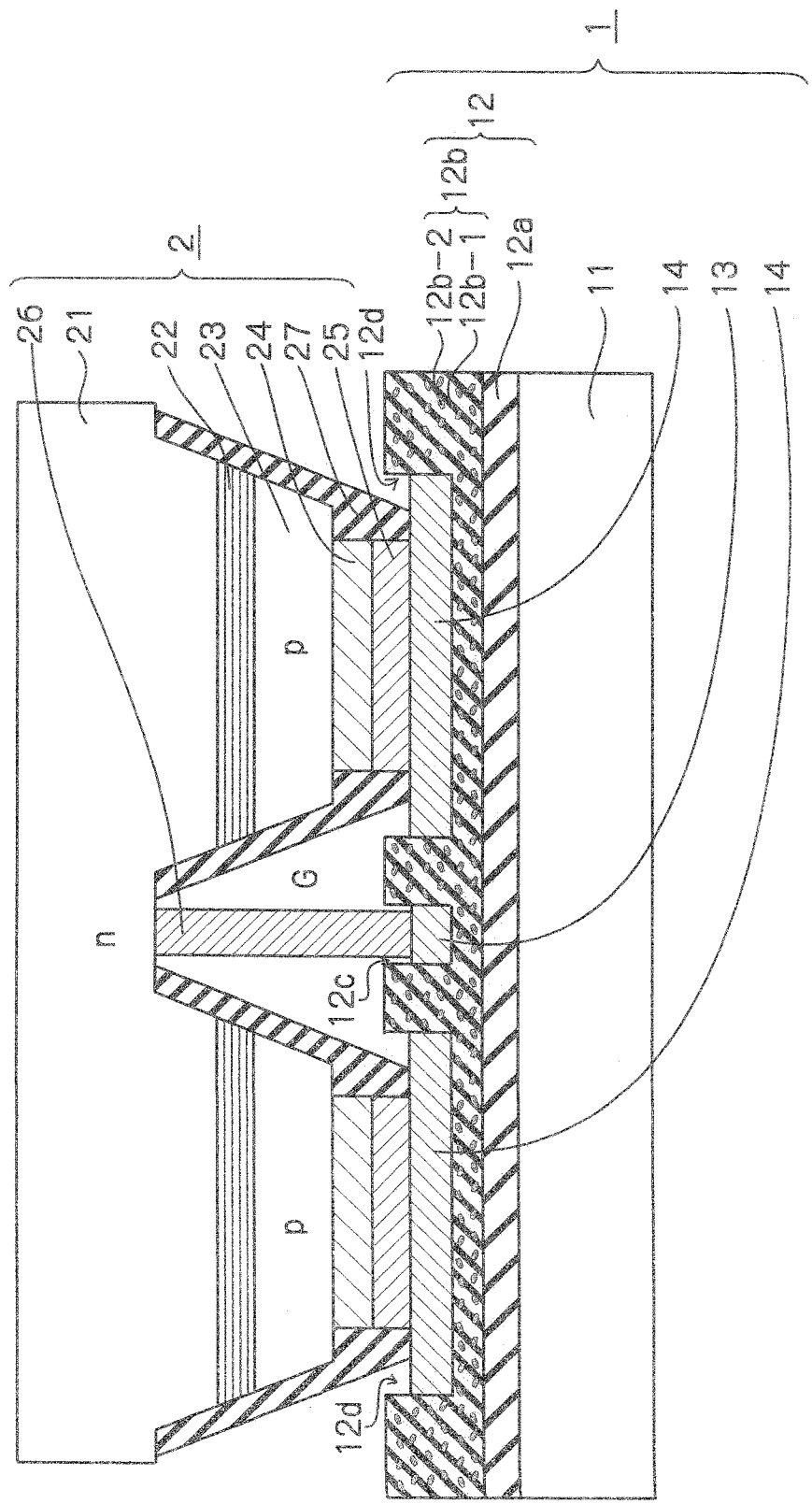
FIG. 2 is a cross-sectional view taken along the line II-II in FIG. 1.

FIG. 1 illustrates a first embodiment of the semiconductor light-emitting device according to the presently disclosed subject matter, and FIG. 2 is a cross-sectional view taken along the line II-II in FIG. 1, In FIGS. 1 and 2, the semiconductor light-emitting device is constructed by a support body 1 and a semiconductor body 2 supported by the support body 1.

The support body 1 includes a support substrate 11 made of heat dissipating material such as Si, an insulating layer 12 formed on the support substrate 11, an n-side wiring layer 13 and a p-side wiring layer 14.

Figure 3:
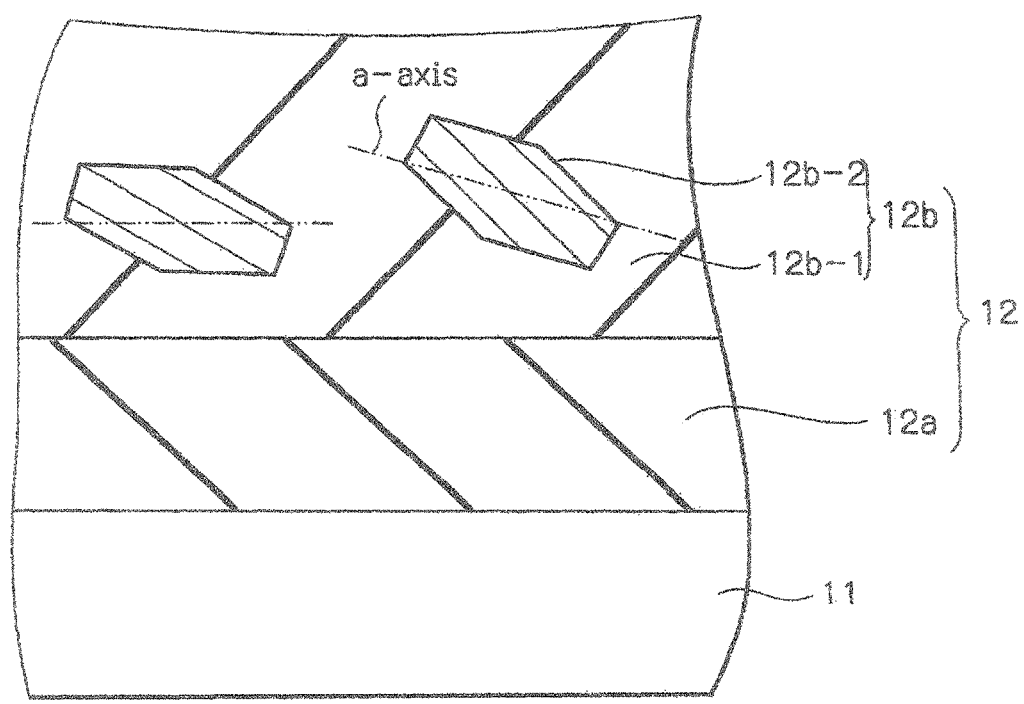
FIG. 3 is a partial enlargement of FIG. 2.

In more detail, the insulating layer 12 is constructed by a lower insulating (buffer) layer 12$a$ made of amorphous boron nitride (a-BN) formed directly on the support substrate 11 and an upper insulating (heat dissipating) layer 12$b$ made of amorphous boron nitride (a-BN) 12b-1 containing hexagonal system boron nitride (h-BN) particles 12b-2 whose a-axes have an large extremely large thermal conductivity λ larger than 400 W/m·K. As illustrated in FIG. 3, which is a partial enlargement of FIG. 2, the a-axes of the h-BN particles 12b-2 are usually arranged in random or in parallel with a boundary surface between the support substrate 11 and the lower insulating layer 12a rather than perpendicular thereto. Therefore, the upper insulating layer 12b has a large thermal conductivity in parallel with the boundary surface between the support substrate 11 and the lower insulating layer 12a.

Note that the upper insulating layer 12b including the h-BN particles 12b-2 has had contact characteristics with the support substrate 11; however, the lower insulating layer 12a has good contact characteristics with both of the support substrate 11 and the upper insulating 1 layer 12b including the h-BN particles 12b-2.

The n-side wiring layer 13 and the p-side wiring layer 14 are separated from each other. Also, the n-side wiring layer 13 is cross-shaped, and is surrounded by the p-side wiring layer 14.

A recess 12c for the n-side electrode 13 and a recess 12d for the p-side electrode 14 are perforated in the upper insulating layer 12b, and the recesses 12c and 12d do not reach the lower insulating layer 12a. Thus, heat from the n-side electrode 13 and the p-side electrode 14 is dissipated mainly transversely within the upper insulating layer 12b.

The n-side wiring layer 13 is made of Au which is electrically connected by a bonding wire $W_{13}$ to an external terminal (not shown), and the p-side wiring type 14 is made of Au which is electrically connected by a bonding wire $W_{14}$ to an external terminal (not shown).

On the other hand, the semiconductor body 2 includes an n-type Si-doped AlInGaN layer 21, an active AlInGaN layer 22 and a p-type Mg-doped AlInGaN layer 23, which are represented by $Al_xIn_yGa_{1-x-y}N$ ($0 \leq x \leq 1$, $0 \leq y \leq 1$). The active AlInGaN layer 22 is of a multiple quantum well (MQW) structure, of a single quantum well (SQW) structure or of a single layer.

Also, a p-side electrode 24 made of Ni/Ag/Ni in this sequence is formed on the p-type AlInGaN layer 23. Further, a bonding layer 25 made of Ti/W/Pt/Au in this sequence is formed on the p-side electrode 24. The bonding layer 25 can be made of refractory metal such as Ti, Pd, Mo, Ru or Ir or noble metal such as Pt or Au to cover the p-side electrode 24. The bonding layer 25 is hardly migrated to avoid the migration of the p-side electrode 24. Note that the bonding layer 25 can be made of Ag/TiN/Ti/Pt/Au/Ti in this sequence to enhance the reflectivity.

A V-shaped groove G is formed in the p-type AlInGaN layer 23, the active AlInGaN layer 22 and the n-type AlInGaN layer 21. Also, an n-side electrode 26 made of Ti/Al/Ti/Pt/Au/In/Au in this sequence is formed on the n-type AlInGaN layer 21.

An insulating layer 27 made of silicon dioxide is formed to cover the n-type AlInGaN layer 21, the active AlInGaN layer 22, the p-type AlInGaN layer 23, the p-side electrode 24 and the bonding layer 25.

The n-side electrode 26 is bonded onto the n-side wiring layer 13, and the bonding layer 25 is bonded onto the p-side wiring layer 14.

In FIGS. 1, 2 and 3, since the upper insulating layer 12b is formed by the amorphous BN layer 12b-1 and the h-BN particles 12b-2 with a high thermal conductivity, heat generated from the semiconductor body 2 is dissipated via the upper insulating layer 12b to the support substrate 11.

A method for manufacturing the semiconductor light-emitting device of FIGS. 1, 2 and 3 is explained next with reference to FIGS. 4A through 4D, 5A, 5B, 6A through 6F and 7.

Formation of Support Body

Figure 4A:
FIGS. 4A through 4D are cross-sectional views for explaining a method for manufacturing the support body of FIGS. 1 and 2.

First, referring to FIG. 4A, a support substrate 11 made of Si is prepared. The support substrate 11 is cleaned by an organic solvent such as acetone using ultrasonic waves for about ten minutes, and then, rinsed by pure water, and sufficiently dried by a nitrogen gas blow. Note that the support substrate 11 can be formed by a semiconductor growing substrate such as sapphire, a metal substrate made of tungsten, carbon or tantalum.

Figure 4B:
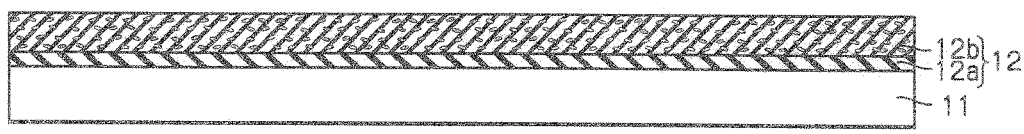
Figure 4C:
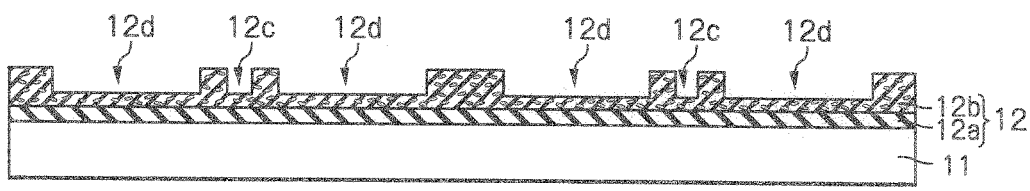
Figure 5A:
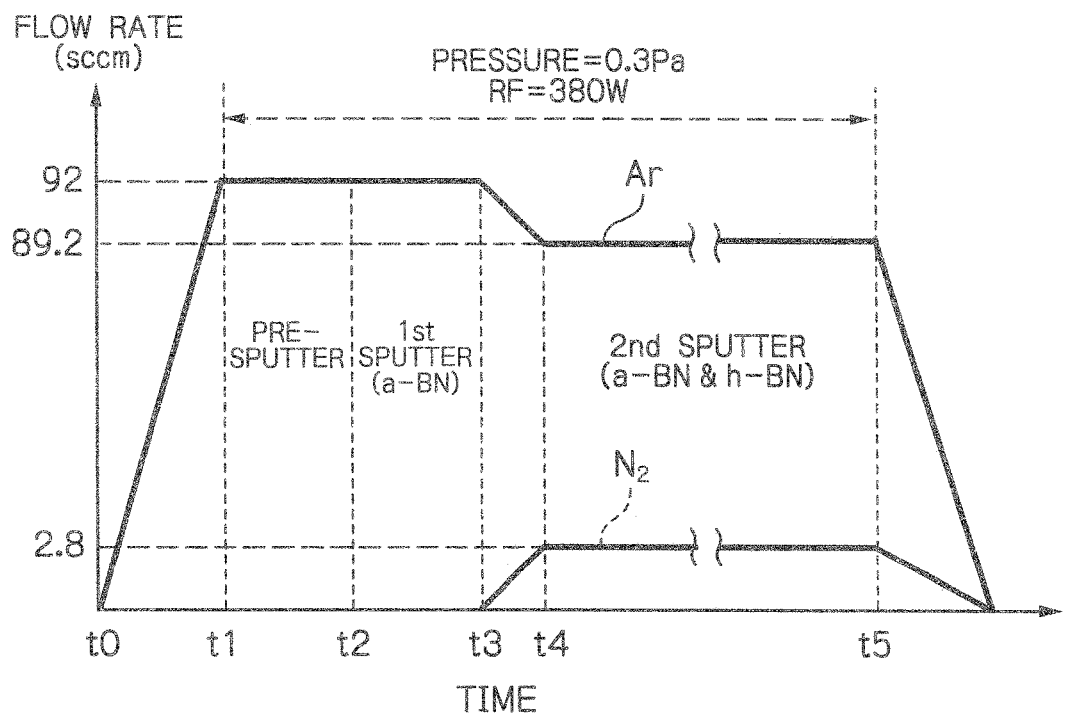
FIG. 5A is a timing diagram for explaining the sputtering process of FIG. 4B.

Next, referring to FIG. 4B, an insulating layer 12 is grown by a sputtering process on the support substrate 11. Initially the support substrate 11 is mounted on a holder. Then, in a sputtering apparatus, the holder is mounted on a rotating plate with a heater. Also, an h-BN target is mounted on a target plate. Then, the pressure in the vacuum chamber is drawn by a vacuum pump to be $1.5 \times 10^{-4}$ Pa, and the rotating plate is rotated while being heated to 400° C., so that the support substrate 11 is degassed and its temperature is stabilized. The sputtering process is carried out in accordance with a timing diagram as illustrated in FIG. 5A.

First, for a time period from t0 to t1, Ar gas is introduced into the vacuum chamber, so that the gas flow of Ar gas is adjusted to be 92 sccm, thus stabilizing the pressure of the vacuum chamber at 0.3 Pa. Then, an RF power supply is turned on to stabilize the plasma at a power of 380 W.

Next, for a time period from t1 to t2, a pre-sputtering process is performed upon the h-BN target while the shutter is closed. Thus, the h-BN target is cleaned.

Next, for a time period from t2 to t3, a first sputtering process using only Ar gas plasma is carried out for 15 minutes.

In this case, the repelling effect by the ion bombardment of Ar ions is so strong that N atoms are repelled from the h-BN target. Thus, a lower insulating layer 12a made of amorphous BN short of N is grown on the support substrate 11.

Next, for a time period from t3 to t4, nitrogen gas is introduced to be 2.8 sccm and the supply flow of Ar gas is decreased to be 89.2 sccm, while the pressure of the vacuum chamber is maintained at 0.3 Pa. In this case, $N_2/(Ar+N_2) = 0.03 = 3\%$.

Next, for a time period from t4 to t5, a second sputtering process using Ar and $N_2$ gas is carried out, so that an about 400 nm thick upper insulating layer 12b including amorphous BN 12b-1 and h-BN particles 12b-2 is grown on the lower insulating layer 12a.

Figure 5B:
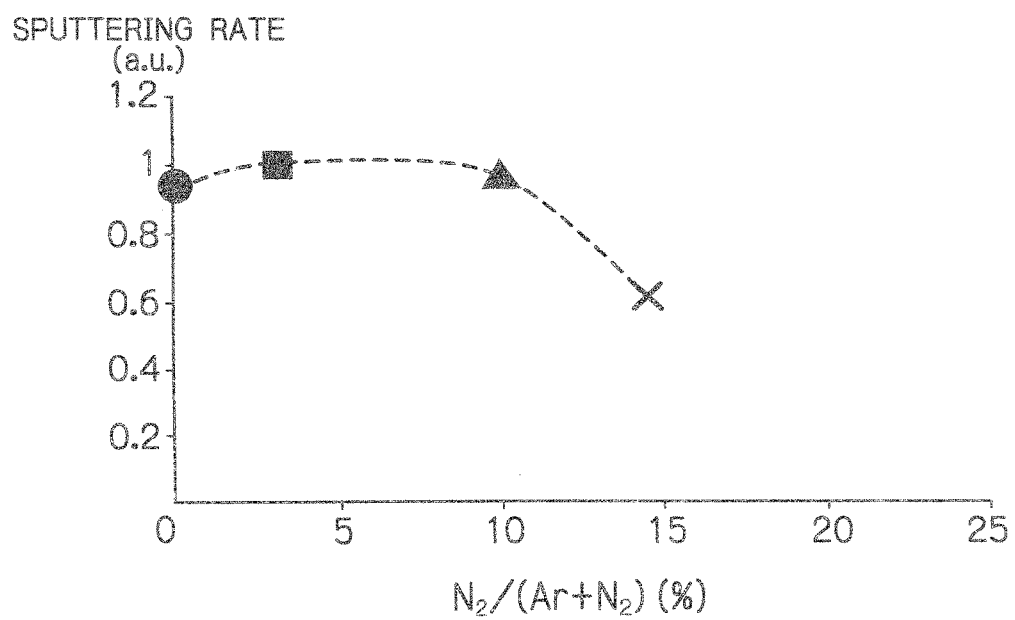
FIG. 5B is a graph showing the sputtering rate characteristics of the h-BN target of FIG. 5A.

In FIG. 5A, a second sputtering process is carried out at the gas flow ratio $N_2/(Ar+N_2) = 3\%$. Note that the gas flow ratio $N_2/(Ar+N_2)$ can be with a range from 3% to 10%. That is, according to the inventor's experiment, as illustrated in FIG. 5B, the sputtering rate for h-BN was maintained at a high level when the gas flow ratio was from 3% to 10%. Note that, when the gas flow rate was larger than 10%, the sputtering rate for h-BN was decreased. When the sputtering rate is at a high level, the grown h-BN has good contact characteristics and heat-resistant characteristics.

Also, the source for nitrogen gas can be an ammonia ($NH_3$) gas source where the molecular weight (=17) of $NH_3$ is smaller than the molecular weight (=39) of Ar. In this case, since the decomposition temperature of $NH_3$ is 800° C., decomposed $NH_3$ gas is supplied or plasma for decomposing $NH_3$ is prepared.

Next, after t5, the shutter is closed and the RF power supply is turned off. Also, the supplying of the Ar gas and the N₂ gas to the vacuum chamber are stopped, thus completing the sputtering process. Then, the heater is turned off to cool the support substrate 11, and the rotating plate is stopped. Then, the vacuum chamber is recovered, and the support substrate 11 is taken out therefrom.

Thus, the lower insulating (buffer) layer 12a is grown by the sputtering process using Ar gas, and the upper insulating layer 12b including the amorphous BN 12b-1 and the h-BN particles 12b-2 is grown by the sputtering process. Next, referring to FIG. 4C, an about 250 nm deep recess 12c and an about 250 nm deep recess 12d are perforated in the upper insulating layer 12b by a photolithography/etching process.

Figure 4D:
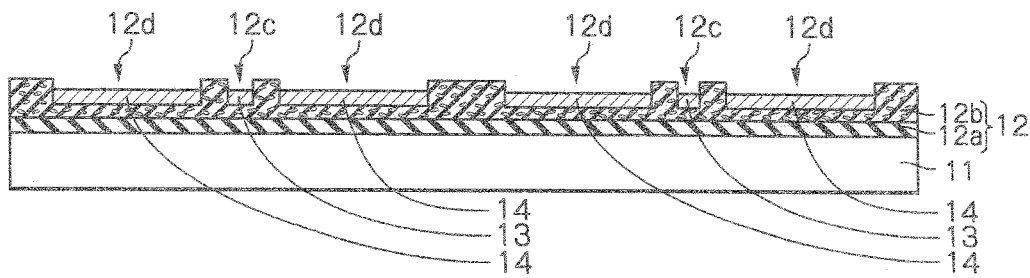

Next, referring to FIG. 4D, an about 200 nm thick n-side wiring layer 13a and an about 200 nm thick p-side wiring layer 14 made of Ti/Pt/Au in this sequence are deposited by an electron beam (EB) evaporation process. In this case, the height of the n-side wiring layer 13 and the p-side wiring layer 14 is smaller than the depth of the recesses 12c and 12d, so that the n-side wiring layer 13 and the p-side wiring layer 14 are completely buried in the recesses 12c and 12d.

Formation of Semiconductor Body

Figure 6A:
FIGS. 6A through 6F are cross-sectional views for explaining a method for manufacturing the semiconductor body of FIGS. 1 and 2.

First, referring to FIG. 6A, a growing sapphire substrate 20 is prepared and is thermally cleaned.

Figure 6B:
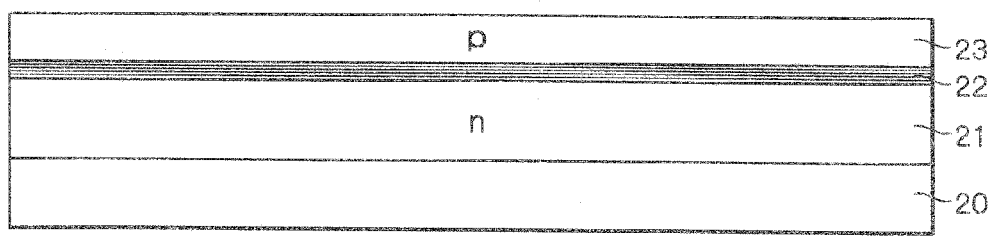

Next, referring to FIG. 6B, an n-type AlInGaN layer 21, an active AlInGaN layer 22 and a p-type AlInGaN layer 23 are sequentially and epitaxially grown on the growing sapphire substrate 20 by a metal organic chemical vapor deposition (MOCVD) process. In this case, the active AlInGaN layer 22 can be of a multiple quantum well (MQW) structure, of a single quantum well (SQW) structure or of a single layer.

Figure 6C:
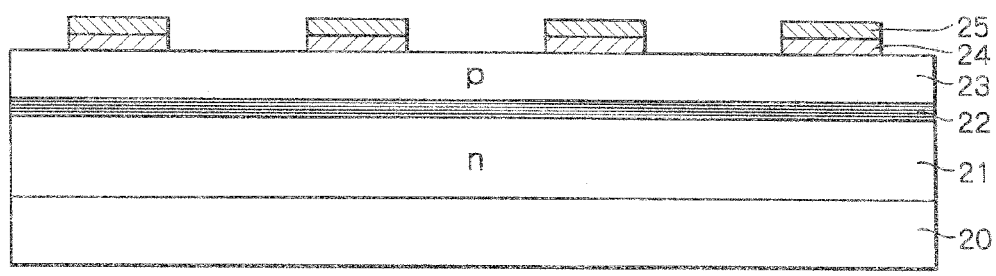

Next, referring to FIG. 6C, an about 100 to 300 nm thick p-side electrode 24 made of Ni/Ag/Ni in this sequence and an about 900 nm bonding layer 25 made of TiW/Pt/Au in this sequence are formed on the p-type AlInGaN layer 23 by a sputtering process or an electron beam (EB) evaporation process, and are patterned by a photolithography/etching process. The bonding layer 25 can be made of refractory metal such as Ti, W, Pt, Pd, Mo, Ru or Ir or noble metal such as Pt or Au to avoid the diffusion of materials of the p-side electrode 24. Note that the bonding layer 25 can be made of Ag/TiW/Pt/Au/Ti in this sequence in order to increase the reflectivity.

Figure 6D:
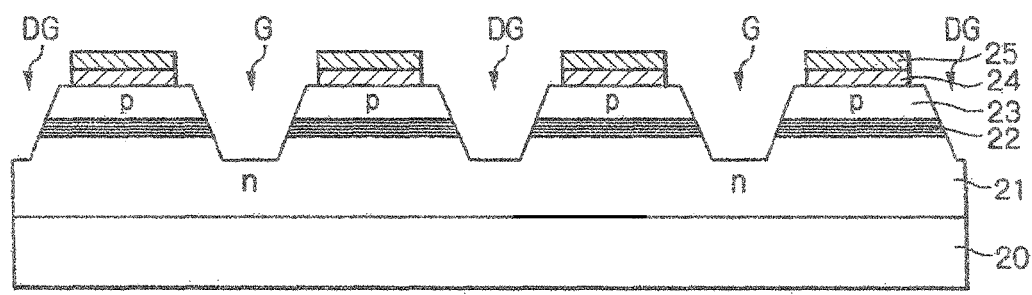

Next, referring to FIG. 6D, a V-shaped groove G and a dicing street groove DG are perforated. In more detail, a photomask (not shown) is formed on the bonding layer 25 and the p-side electrode 24. Then, the p-side electrode 24, the p-type AlInGaN layer 23 and the active AlInGaN layer 22 are etched by a dry etching process such as a reactive ion etching (RIE) process using the photomask.

Figure 6E:
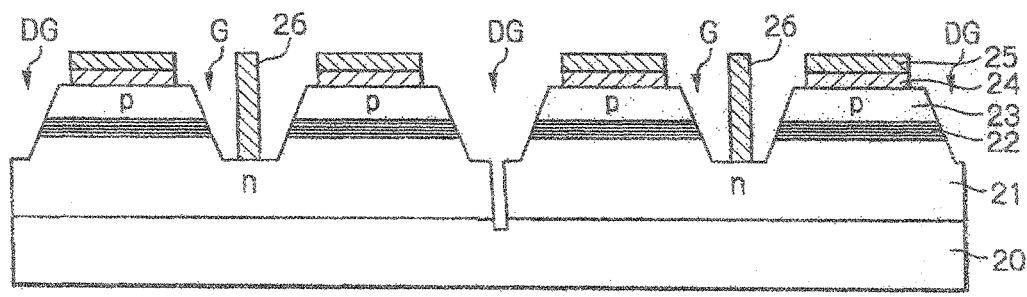

Next, referring to FIG. 6E, an about 2800 nm thick n-side electrode 26 made of Ti/Al/Ti/Pt/Au/In/Au in this sequence is deposited on a part of the n-type AlInGaN layer 21 by a sputtering process and a photolithography and etching process.

Next, the dicing street groove DG is further etched by a dry etching process using $Cl_2$ and $Ar_2$ gas to reach the growing sapphire substrate 20, so that the LED elements are individually separated from each other. Thus, the dicing street groove DG is enlarged.

Figure 6F:
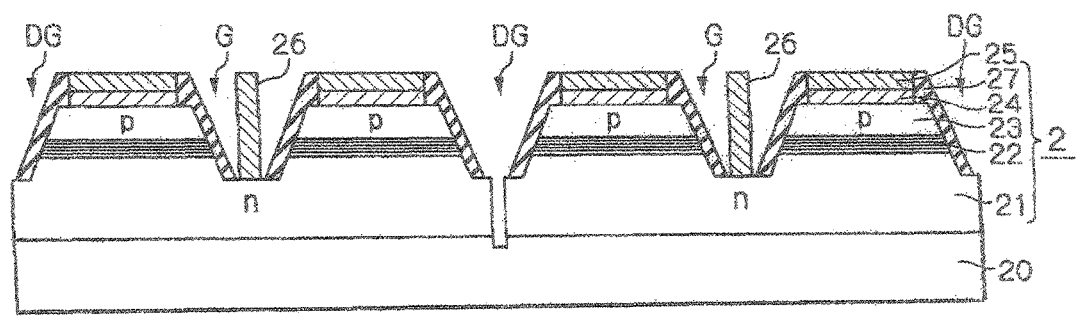

Next, referring to FIG. 6F, an insulating layer 27 made of silicon dioxide or silicon nitride is deposited on the sidewall of the groove G by a sputtering process or a CVD process and a photolithography/etching process.

Wafer Bonding

Figure 7:
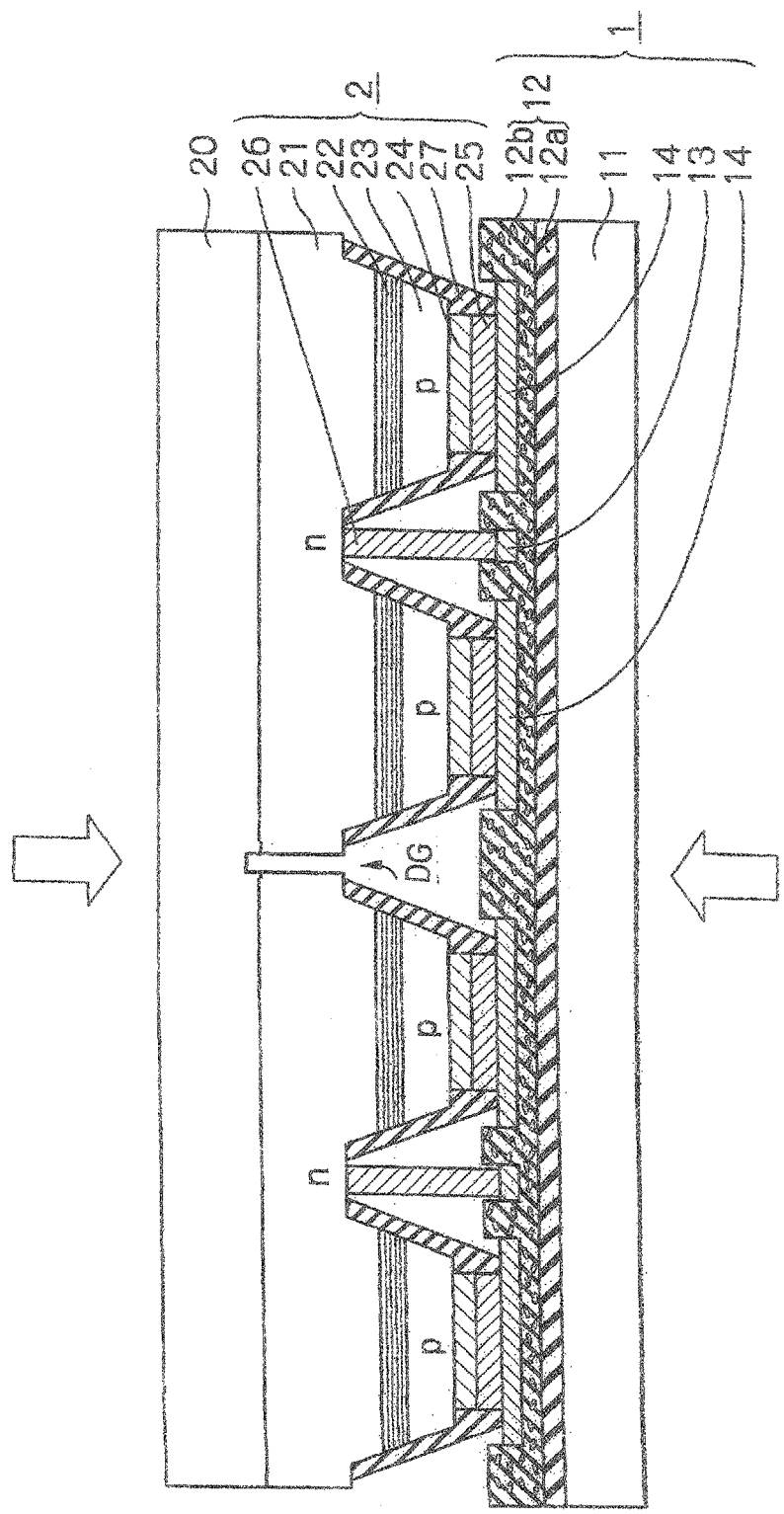
FIG. 7 is a cross-sectional view for explaining the wafer bonding process of the semiconductor light-emitting device of FIGS. 1 and 2.

Referring to FIG. 7, the semiconductor body 2 of FIG. 6F is bonded by a thermal pressurizing process using a pressure of about 3 MPa at a temperature of about 200° C. onto the support body 1 of FIG. 4D. As a result, the n-side electrode 26 is bonded to the n-side wiring layer 13, and the bonding layer 25 is bonded to the p-side wiring layer 14. In this case, an InAu alloy is generated between the n-side electrode 26 and the n-side wiring layer 13, a solid diffusion bonding occurs between the bonding layer 25 and the p-side wiring layer 14. Note that AuSn eutectic bonding or other bonding can be carried out between the n-side electrode 26 and the n-side wiring layer 13 and between the bonding layer 25 and the p-side wiring layer 14.

Removal of Growing Substrate

Next, the growing sapphire substrate 20 is removed by a laser lift-off process, a wet etching process, a dry etching process, a chemical-mechanical polishing (CMP) process or a mechanical polishing process.

Finally, the LED elements are separated from each other by performing a dicing process using dicing blades upon the n-type AlInGaN layer 21 at the dicing street groove DG.

As occasion demands, an anisotropic wet etching process using tetramethyl ammonium hydroxide (TMAH) is performed upon the n-type AlInGaN layer 21, so that the n-type AlInGaN layer 11 can have a protruded light extracting surface to suppress the total internal reflection component and the Fresnel component, thus improving the light extracting efficiency. Note that such a protruded light extracting surface can be obtained by a photolithography process, an electron beam (EB) lithography process, an EB depicting process, a nano imprint process, a laser exposing process and a lift-off process to form an artificially periodic mask pattern on the n-type AlInGaN layer 21 and a dry etching process using the mask pattern.

Figure 8:
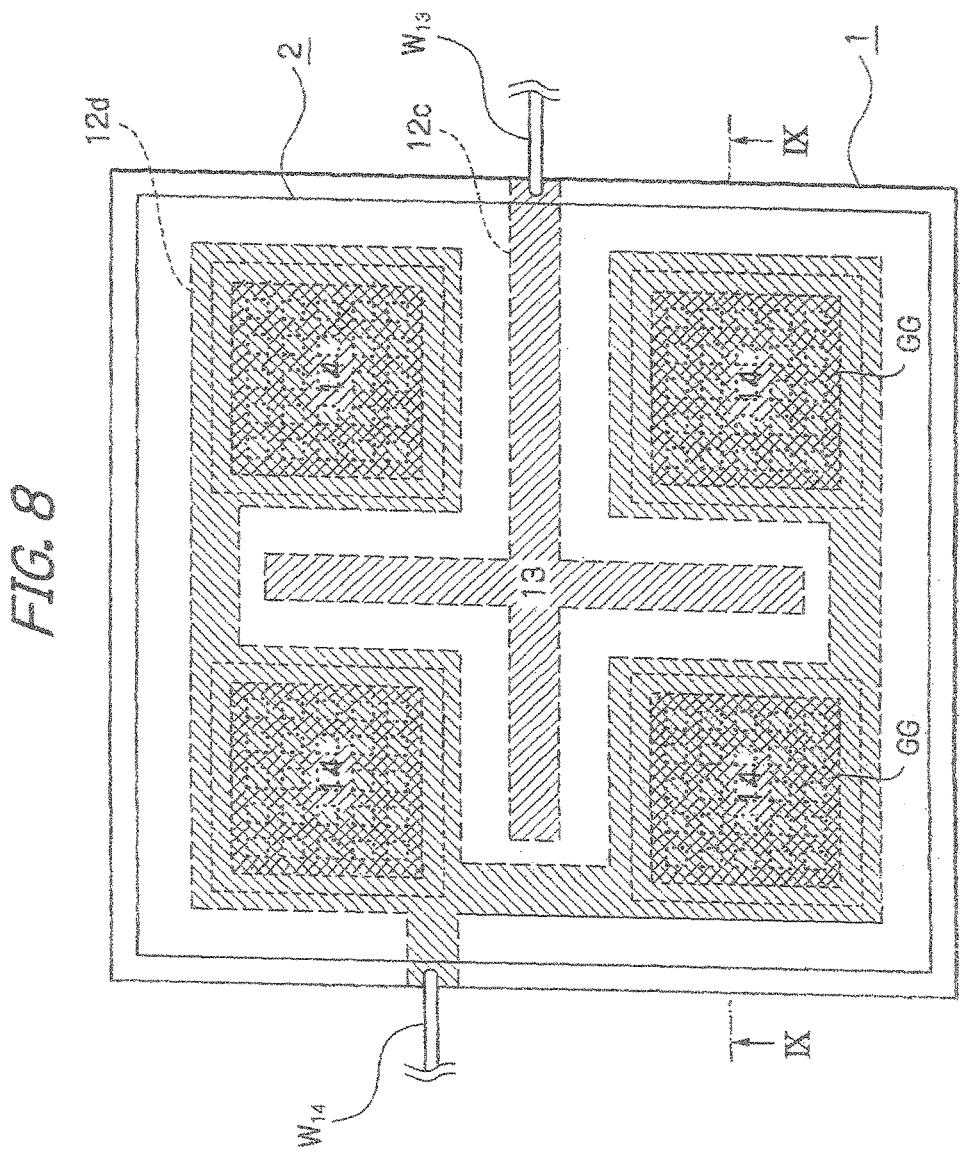
FIG. 8 is a plan view illustrating a second embodiment of the semiconductor light-emitting device according to the presently disclosed subject matter.
Figure 9:
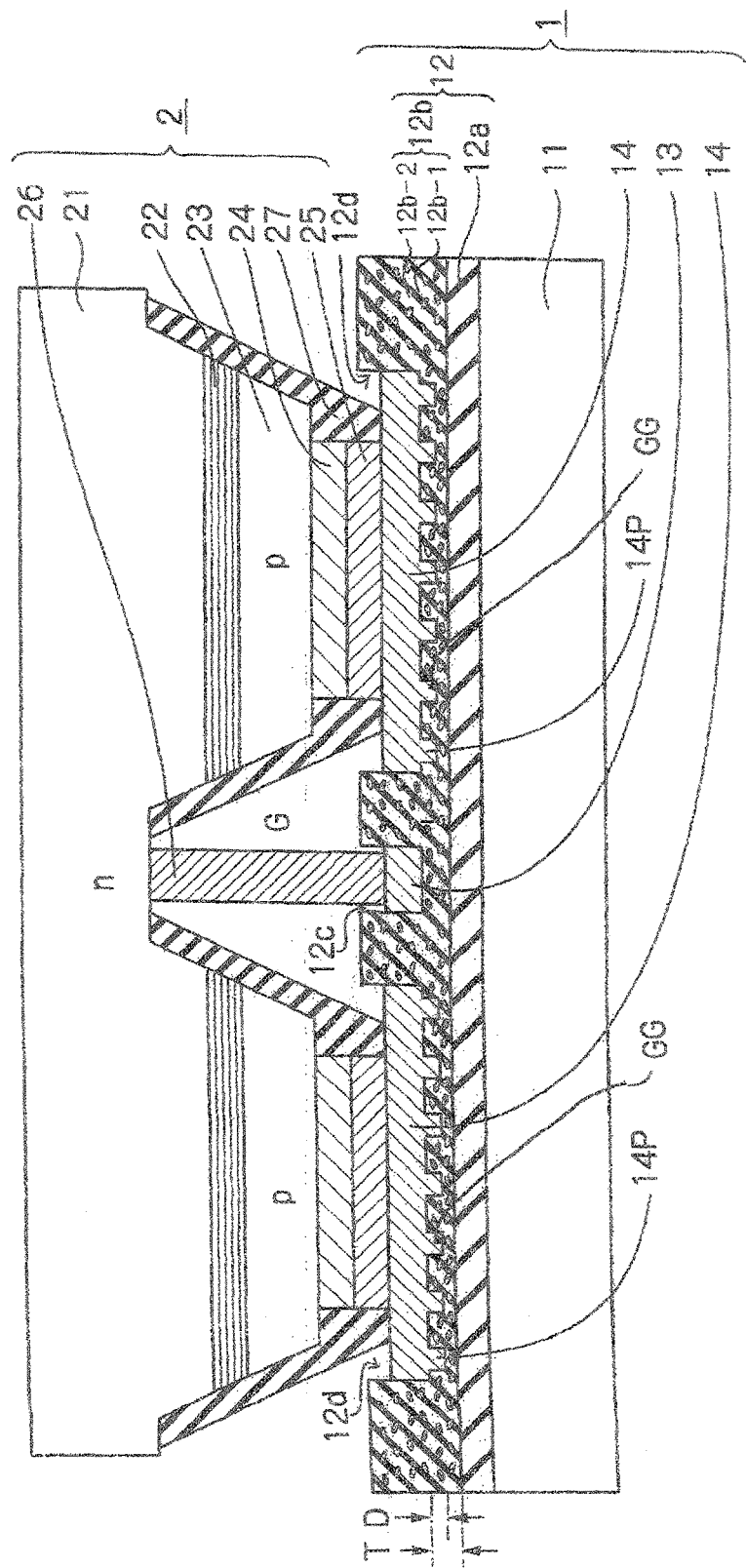
FIG. 9 is a cross-sectional view taken along the line IX-IX in FIG. 8.

FIG. 8 illustrates a second embodiment of the semiconductor light-emitting device according to the presently disclosed subject matter, and FIG. 9 is a cross-sectional view taken along the line IX-IX in FIG. 8.

In FIGS. 8 and 9, a grid-shaped groove GG is formed at the recess 12d in the upper insulating layer 12b, so that the p-side wiring layer 14 has protrusions 14P penetrated into the upper insulating layer 12b. As a result, the vertical transfer of heat from the bonding layer 25 via the upper insulating layer 12b to the support substrate 11 is enhanced while the horizontal transfer of heat within the upper insulating layer 12b is mitigated. Thus, the heat dissipating effect can be further enhanced as compared with the first embodiment.

The grid-shaped groove GG in the upper insulating layer 12b at the recess 12d can be formed by performing a dry etching process upon the upper insulating layer 12b using a photomask before the formation of the wiring layers 13 and 14.

Figure 10:
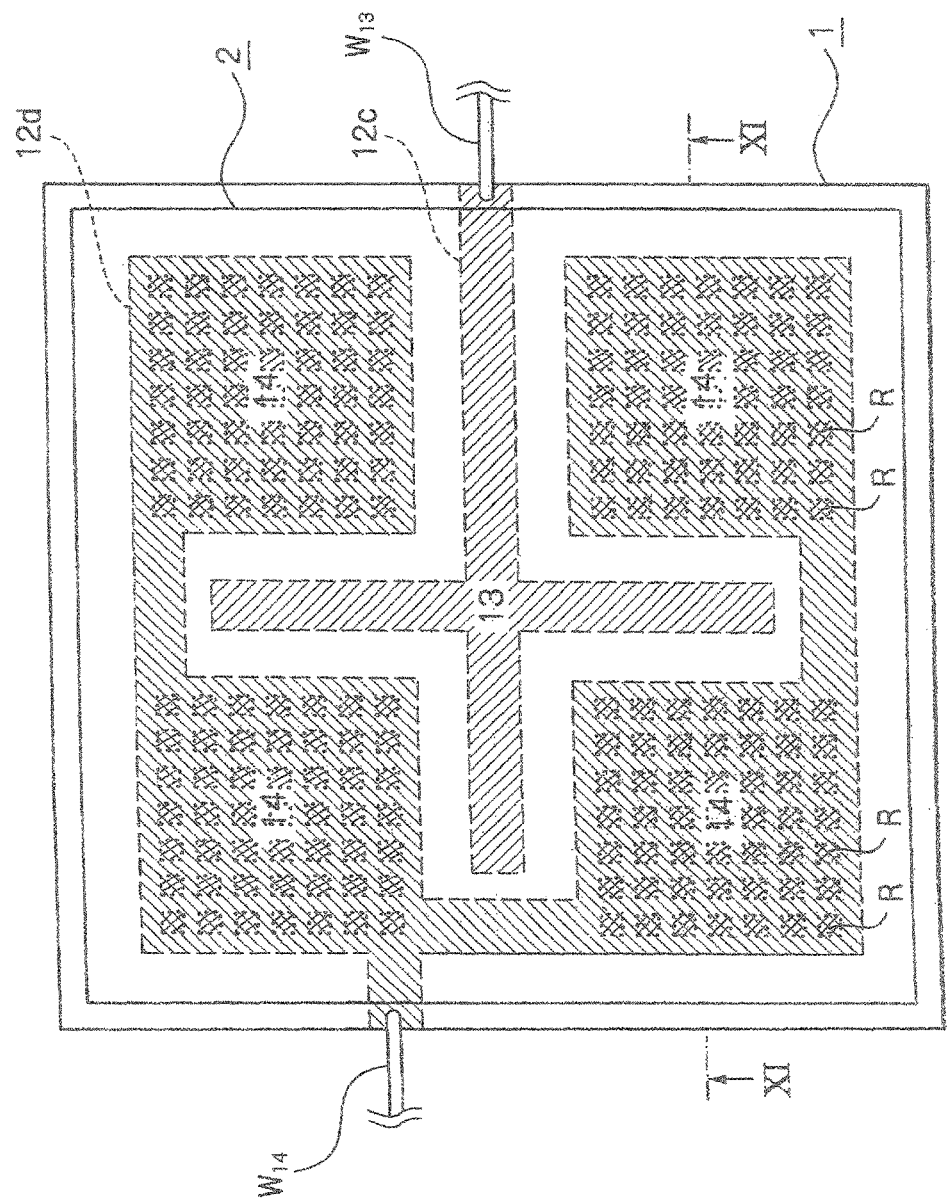
FIG. 10 is a plan view illustrating a modification of the semiconductor light-emitting device of FIG. 8.
Figure 11:
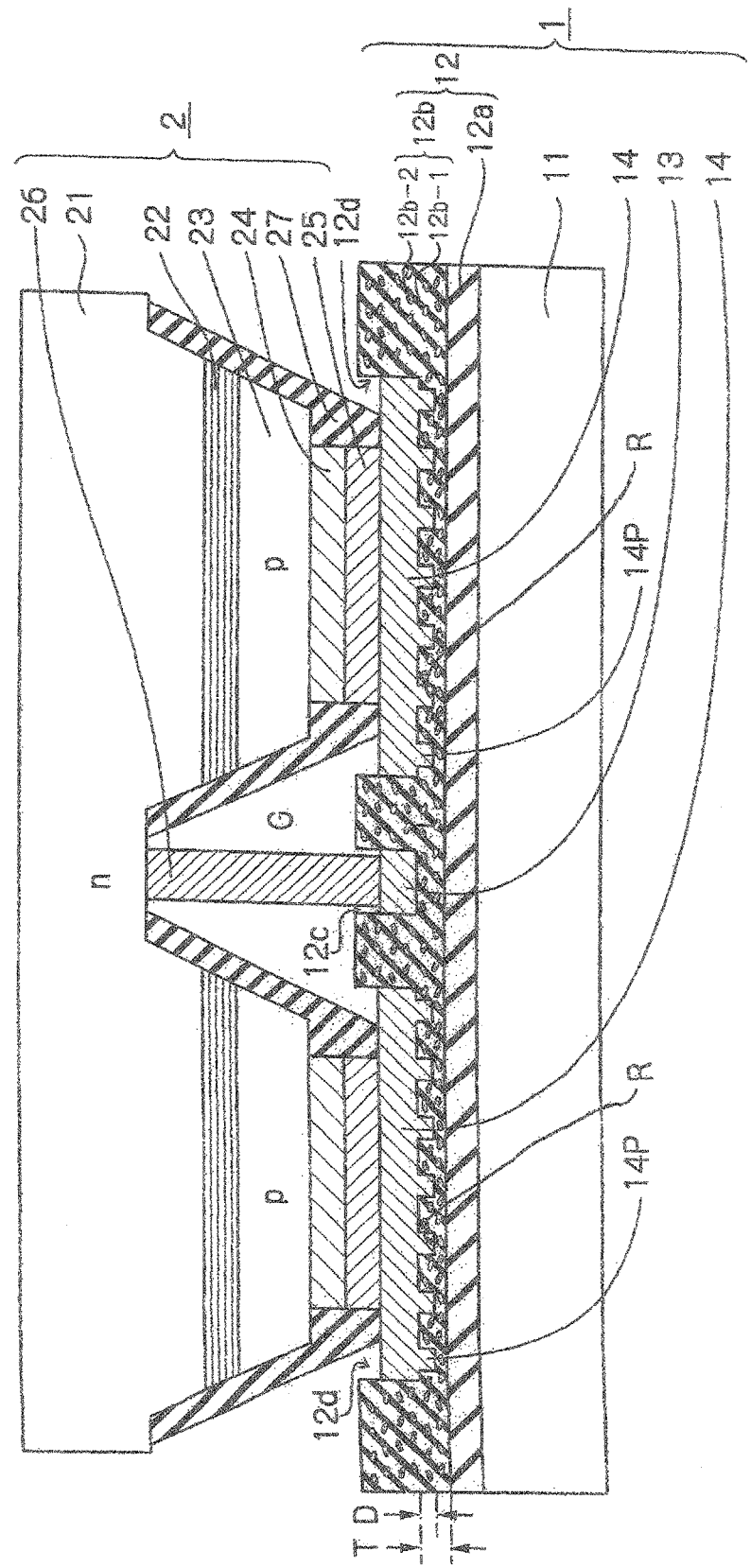
FIG. 11 is a cross-sectional view taken along the line XI-XI in FIG. 10.

FIG. 10 is a plan view illustrating a modification of the semiconductor light-emitting device of FIG. 8, and FIG. 11 is a cross-sectional view taken along the line XI-XI in FIG. 10.

In FIGS. 10 and 11, instead of the grid-shaped groove GG of FIGS. 8 and 9, matrix-arranged recesses R are provided. Even in FIGS. 10 and 11, the p-side wiring layer 14 has protrusions 14P penetrated into the upper insulating layer 12b. As a result, the vertical transfer of heat from the bonding layer 25 via the upper insulating layer 12b to the support substrate 11 is enhanced while the horizontal transfer of heat within the upper insulating layer 12b is mitigated.

Thus, the heat dissipating effect can be further enhanced as compared with the first embodiment.

The matrix-arranged recesses R in the upper insulating layer 12b at the recess 12d can be formed by performing a dry etching process upon the upper insulating layer 12b using a photomask before the formation of the wiring layers 13 and 14.

Even in FIGS. 9 and 11, the height D of the protrusions 14P, i.e., the depth of the groove GG or the recess R preferably satisfies the following:

$$T/2 < D < 2T/3$$

where T is the thickness of the upper insulating layer 12b. If D<T/2, the vertical transfer from the bonding layer 25 to the support substrate 11 is insufficient. On the other hand, if D>2T/3, the upper insulating layer 12b is fissioned so that heat horizontal transfer in the upper insulating layer 12b is obstructed, so that the heat dissipating effect is decreased.

Note that, slit-shaped recessed can be provided instead of the grid-shaped groove GG in FIGS. 8 and 9 and the matrix-arranged recesses R in FIGS. 10 and 11.

Figure 12A:
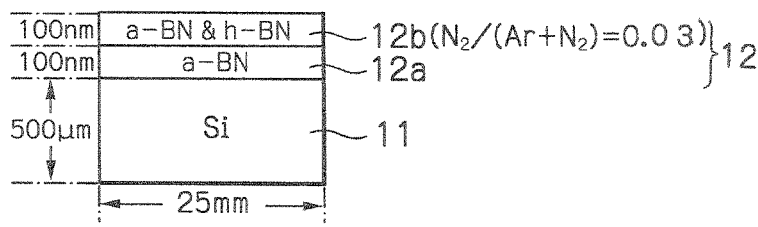
FIGS. 12A, 12B, 12C 12D, 12E and 12F are cross-sectional views of Samples for explaining the heat transfer characteristics of the insulating layer of FIGS. 1, 2, 8, 9, 10 and 11.
Figure 12B:
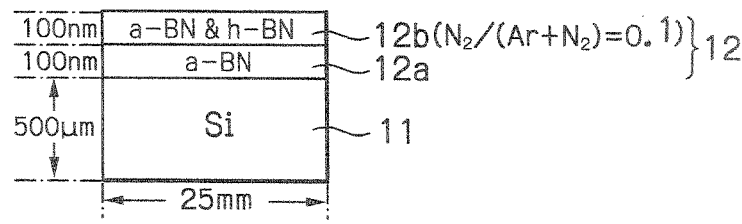
Figure 12C:
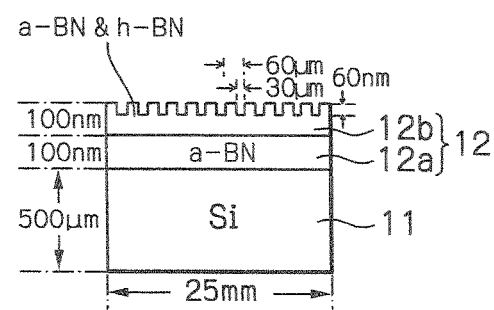
Figure 12D:
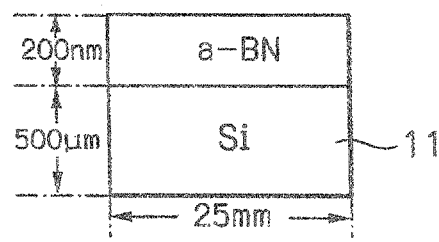

The evaluation of the characteristics of the insulating layer 12 will be explained below by using the following Samples 1, 2, 3, 4, 5 and 6 using the common support substrate 11 made of 500 μm thick Si with a size of 25 mm×25 mm:

Sample 1 (1st embodiment) is illustrated in FIG. 12A where the lower insulating layer 12a is made of 100 nm thick amorphous BN (a-BN), and the upper insulating layer 12b is made of 100 nm thick amorphous BN (a-BN) containing hexagonal system BN (h-BN) particles formed at the ratio of $N_2/(Ar+N_2)=3\%$;

Sample 2 (1st embodiment) is illustrated in FIG. 12B where the lower insulating layer 12a is made of 100 nm thick amorphous BN (a-BN), and the upper insulating layer 12b is made of 100 nm thick amorphous BN (a-BN) containing hexagonal system BN (h-BN) particles formed at the ratio of $N_2/(Ar+N_2)=10\%$;

Sample 3 (2nd embodiment) is illustrated in FIG. 12C where the lower insulating layer 12a is made of 100 nm thick amorphous BN (a-BN), and the upper insulating layer is made of 100 nm thick amorphous BN (a-BN) having protrusions with a height of 60 nm, a pitch of 60 μm and a width of 30 μm;

Sample 4 is illustrated in FIG. 12D where the insulating layer is made of 200 nm thick amorphous BN (a-BN)

Figure 12E:
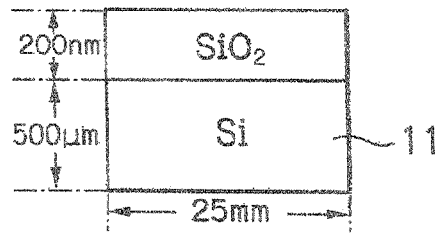
Figure 12F:

Sample 5 (Prior Art) is illustrated in FIG. 12E where the insulating layer is made of 200 nm thick silicon dioxide ($SiO_2$); and Sample 6 is illustrated in FIG. 2E where there is no insulating layer.

Evaluation of Heat Transfer Characteristics

Figure 13A:
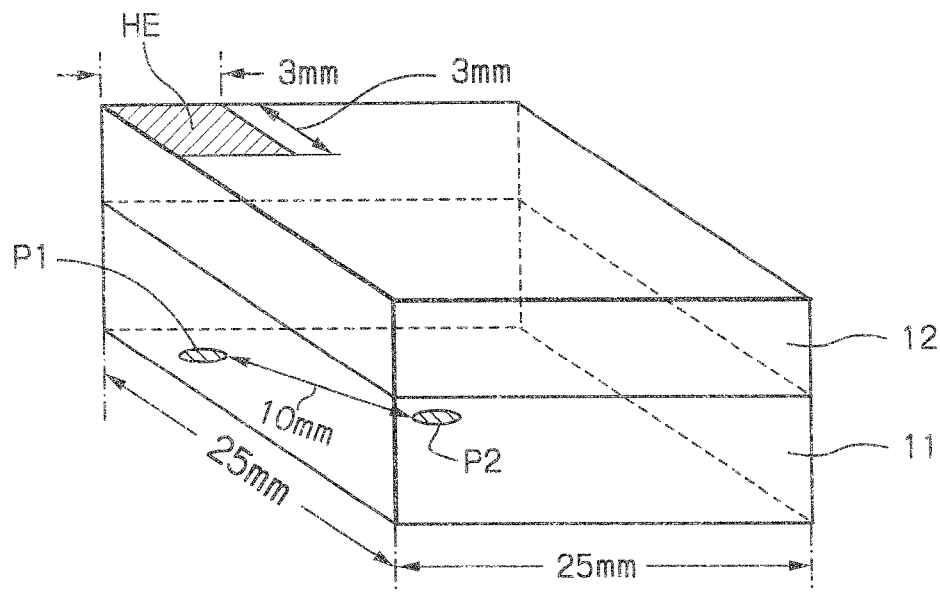
FIGS. 13A and 13B are schematic perspective views illustrating the heater area and temperature measuring points of Samples of FIGS. 12A, 12B 12C, 12D, 12E and 12F.
Figure 13B:
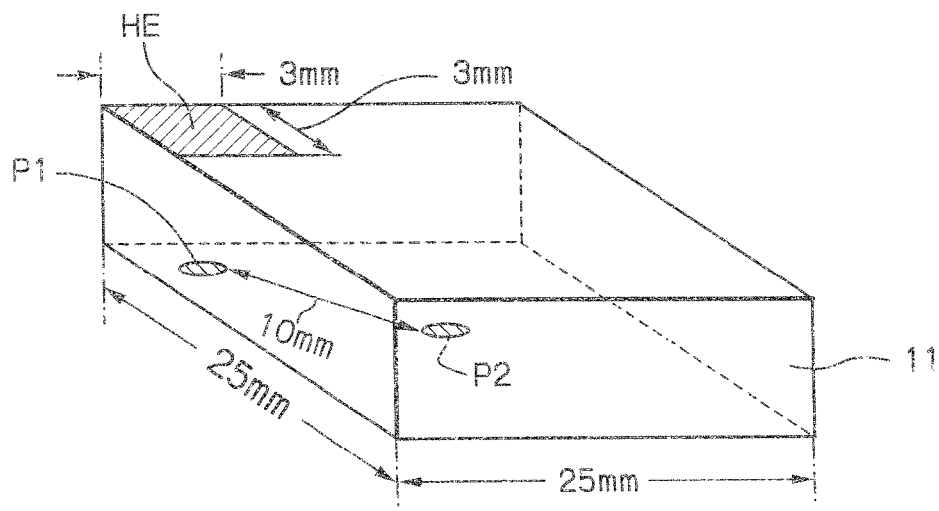

The evaluation of heat transfer characteristics was carried out by heating a heater area HE with a size of 3 mm×3 mm and obtaining a temperature T1 at a point P1 immediately below the heater area HE and a temperature T2 at a point P2 apart by a diagonal distance L=10 mm from the point P1 as illustrated in FIGS. 13A and 13B. Note that Samples 1, 2, 3, 4 and 5 are illustrated in FIG. 13A, and Sample 6 is illustrated in FIG. 13B.

The vertical heat transfer characteristics as illustrated in FIG. 14A were obtained by heating the heater area HE to 177.5° C. and 98.5° C. for 5 minutes and the temperature T1 at the point P1 immediately below the heater area HE. At the high temperature 177.5° C. of the heater area HE, Sample 3 (2nd embodiment)
>Sample 6
>Sample 2 (1st embodiment)
>Sample 1 (1st embodiment)
>Sample 4
>Sample 5

On the other hand, at the low temperature 98.5° C. of the heater area HE,

Sample 3 (2nd embodiment)
=Sample 6
>Sample 2 (1st embodiment)
>Sample 1 (1st embodiment)
>Sample 4
>Sample 5

The horizontal heat transfer characteristics as illustrated in FIG. 14B were obtained by heating the heater area HE to 177.5° C. and 98.5° C. for 5 minutes and the temperature T2 at the point P2 apart diagonally from the heater area HE. At the high temperature 177.5° C. of the heater area HE, Sample 3 (2nd embodiment)
>Sample 1 (1st embodiment)
>Sample 2 (1st embodiment)
>Sample 6
>Sample 5
>Sample 4

On the other hand, at the low temperature 98.5° C. of the heater area HE,

Sample 1 (1st embodiment)
=Sample 6
>Sample 3 (2nd embodiment)
>Sample 2 (1st embodiment)
>Sample 4
>Sample 5

Thus, the heat transfer characteristics of Sample 1 (1st embodiment), Sample 2 (1st embodiment) and Sample 3 (2nd embodiment) containing the h-BN particles are more excellent than those of Samples 4, 5 and 6 containing no h-BN particles.

Particularly, the heat transfer characteristics of Sample 3 (2nd embodiment) are excellent at the high and low temperatures of the heater area HE in the vertical and horizontal directions.

Also, the horizontal heat transfer of Sample 1 (1st embodiment), Sample 2 (1st embodiment) and Sample 3 (2nd embodiment) containing the h-BN particles are better than those of Sample 6 containing no insulating layer. This is because Sample 1 (1st embodiment), Sample 2 (1st embodiment) and Sample 3 (2nd embodiment) are considered to have h-BN particles whose axes are in parallel with the boundary surface between the support substrate 11 and the insulating layer 12 rather than perpendicular thereto.

Further, since the protrusions of Sample 3 (2nd embodiment) contribute to enhancing the vertical thermal conductivity characteristics, the vertical thermal conductivity characteristics of Sample (2nd embodiment) are better than those of Sample 1 (1st embodiment) and Sample 2 (1st embodiment).

Figure 15:
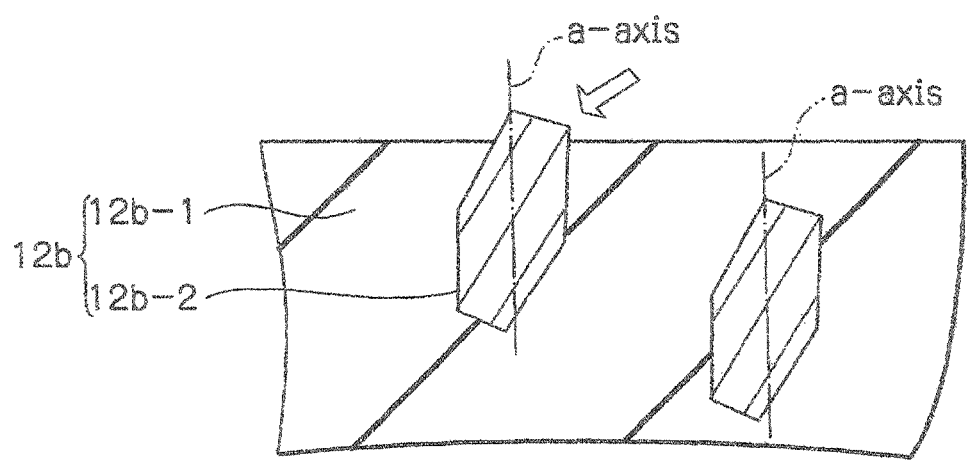
FIG. 15 is a partial cross-sectional view of Sample 2 of FIG. 12B.

Furthermore, the vertical thermal conductivity characteristics of Sample 2 (1st embodiment) are considered to be perpendicular to the boundary surface between the support substrate 11 and the insulating layer 12 rather than in parallel therewith. As shown in FIG. 15, which is a partial cross-sectional view of Sample 3, one hexagonal system BN particle as indicated by an arrow is protruded perpendicularly from the surface of the upper insulating layer 12b.

Determination of Existence of h-BN

Figure 16:
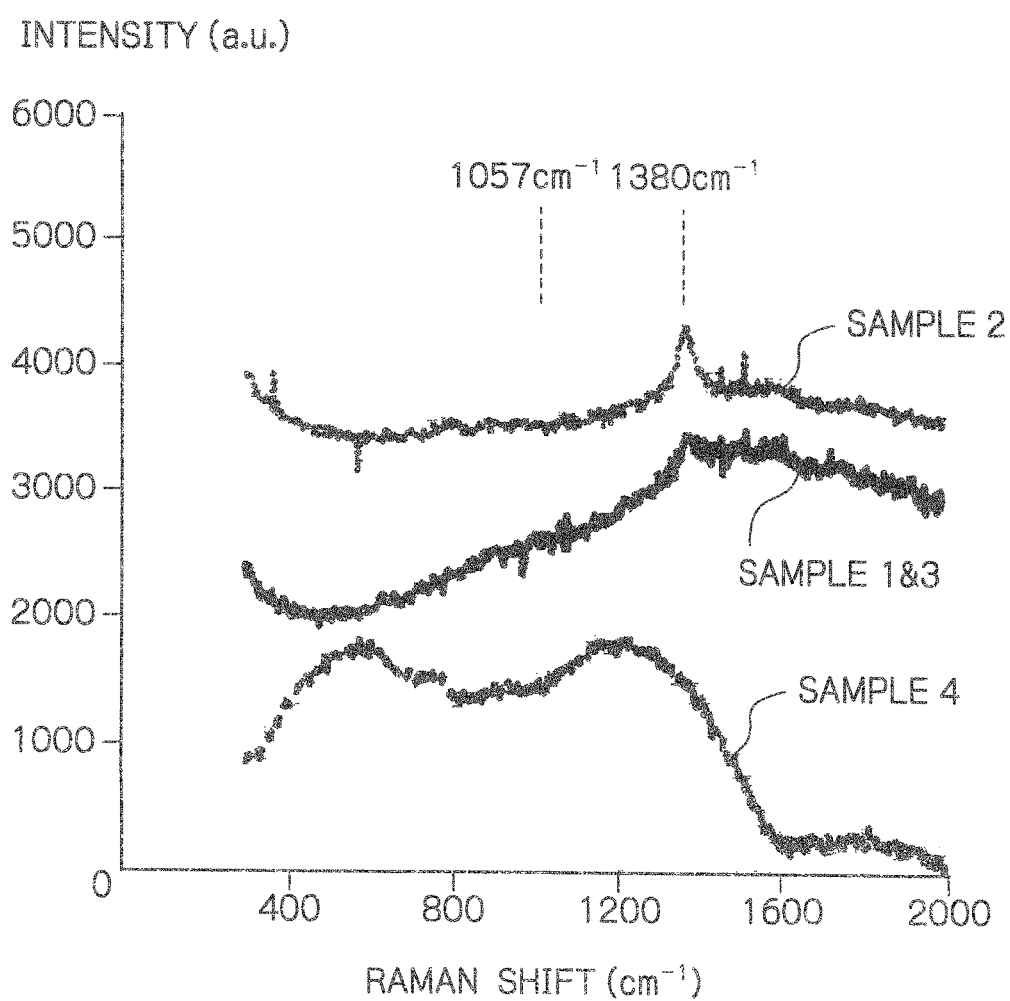
FIG. 16 is a graph of Raman spectra of Samples 1, 2, 3 and 4 of FIGS. 12A, 12B, 12C and 12D.

The existence of h-BN can be determined by a Raman spectrum analysis where a peak 1380 cm$^{-1}$ shows h-BN while a peak 1057 cm$^{-1}$ shows cubic system BN. As shown in FIG. 16, peaks 1380 cm$^{-1}$ were observed in Sample 1 (1st embodiment), Sample 2 (1st embodiment) and Sample 3 (2nd embodiment), so that h-BN particles were determined to be included in Sample 1 (1st embodiment), Sample 2 (1st embodiment) and Sample 3 (2nd embodiment). On the other hand, a peak 1380 cm$^{-1}$ was not observed in Sample 4, so that only amorphous BN (a-BN) was included in Sample 4.

Evaluation of Heat-Resistant Characteristics of h-BN

Figure 17:
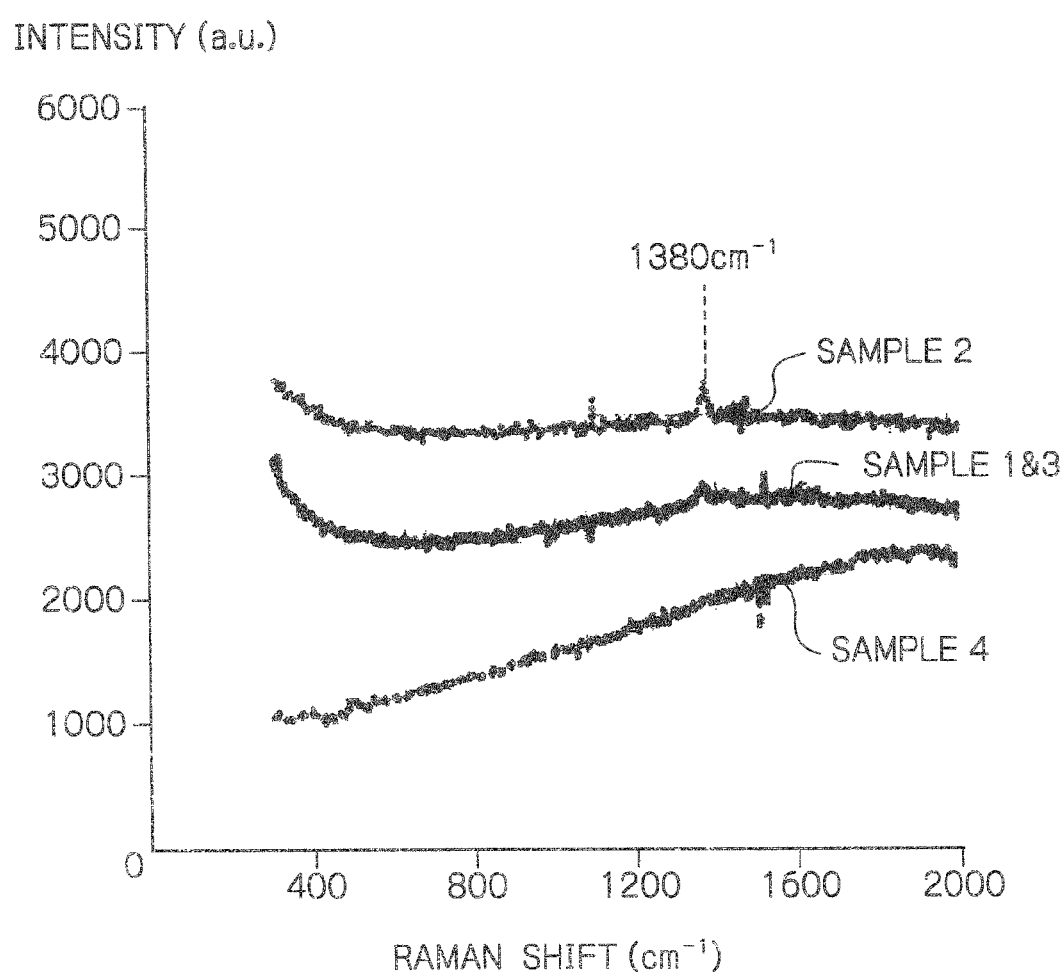
FIG. 17 is a graph of Raman spectra of Samples 1, 2, 3 and 4 of FIGS. 12A, 12B, 12C and 12D after a heat treatment.

Sample 1 (1st embodiment), Sample 2 (1st embodiment), Sample 3 (2nd embodiment) and Sample 4 (only a-BN) where the support substrate 11 was made of refractory metal tungsten (W) were prepared. Then, Samples 1, 2, 3 and 4 were attached to power supply electrodes within a vacuum chamber, and then, N$_2$ gas was introduced thereinto so that the pressure within the chamber became at 50 kPa. Then, a power was supplied to electrodes to heat Sample 1 (1st embodiment), Sample 2 (1st embodiment), Sample 3 (2nd embodiment) and Sample 4 (only a-BN) to about 2000 K at a rate of 200 K/min. Then, the temperature of Sample 1 (1st embodiment), Sample 2 (1st embodiment), Sample 3 (2nd embodiment) and Sample 4 (only a-BN) at 2000 K was maintained for 10 minutes. Then, Sample 1 (1st embodiment), Sample 2 (1st embodiment), Sample 3 (2nd embodiment) and Sample 4 (only a-BN) were cooled at a rate of 200 K/min. In this case, the temperature was monitored by an SR3-IR infrared spectrometer, Topcon Corporation. Then, a Raman spectrum analysis was carried out. As shown in FIG. 17, peaks 1380 cm$^{-1}$ were observed in Sample 1 (1st embodiment), Sample 2 (1st embodiment) and Sample 3 (2nd embodiment), so that h-BN particles were determined to he still included in Sample 1 (1st embodiment), Sample 2 (1st embodiment) and Sample 3 (2nd embodiment). On the other hand, a peak 1380 cm$^{-1}$ was not observed in Sample 4. That is, although amorphous BN was sublimated, the h-BN particles were not sublimated by the high temperature, and the contact characteristics of the upper insulating layer 12 to the support substrate 11 were maintained.

The above-described embodiments relate to the semiconductor light-emitting device; however, the presently disclosed subject matter can be applied to a semiconductor device other than the semiconductor light-emitting device.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A semiconductor device comprising:
a support substrate;
an insulating layer provided on said support substrate; and
a semiconductor element provided on said insulating layer,
wherein said insulating layer comprises:
a lower insulating layer consisting of amorphous boron nitride provided directly on an upper surface of said support substrate; and
an upper insulating layer provided on an entire surface of said lower insulating layer and including amorphous boron nitride and hexagonal system boron nitride particles in said amorphous boron nitride,
wherein grooves are provided on a surface of said upper insulating layer, and
wherein said grooves are grid-shaped.

2. A semiconductor device comprising:
a support substrate;
an insulating layer provided on said support substrate; and
a semiconductor element provided on said insulating layer,
wherein said insulating layer comprises:
a lower insulating layer consisting of amorphous boron nitride provided directly on an upper surface of said support substrate; and
an upper insulating layer provided on an entire surface of said lower insulating layer and including amorphous boron nitride and hexagonal system boron nitride particles in said amorphous boron nitride,
wherein grooves are provided on a surface of said upper insulating layer, and
wherein a depth D of said grooves satisfies:

$$T/2 < D < 2T/3$$

where T is a thickness of said upper insulating layer.

* * * * *